US006777172B2

(12) United States Patent
Mittelstadt

(10) Patent No.: US 6,777,172 B2
(45) Date of Patent: Aug. 17, 2004

(54) METHOD AND APPARATUS FOR USING AN EXCIMER LASER TO PATTERN ELECTRODEPOSITED PHOTORESIST

(75) Inventor: Laurie S. Mittelstadt, Belmont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 379 days.

(21) Appl. No.: 09/917,650

(22) Filed: Jul. 31, 2001

(65) Prior Publication Data

US 2003/0027084 A1 Feb. 6, 2003

(51) Int. Cl.[7] ................................................. G03F 7/20
(52) U.S. Cl. ..................... 430/325; 430/322; 430/945; 355/67
(58) Field of Search ............................... 430/318, 322, 430/323, 325, 945; 355/67, 71, 53

(56) References Cited

U.S. PATENT DOCUMENTS

| 4,773,750 | A |   | 9/1988 | Bruning ...................... 353/122 |
| 4,983,252 | A | * | 1/1991 | Masui et al. ................ 156/630 |
| 5,894,058 | A |   | 4/1999 | Hatakeyama et al. ........ 430/313 |
| 6,077,644 | A |   | 6/2000 | Hada et al. ............... 430/270.1 |

FOREIGN PATENT DOCUMENTS

| JP | 6-077629 A | * | 3/1994 |
| JP | 8-167769 A | * | 6/1996 |

OTHER PUBLICATIONS

J. F. Kuhmann, et al., "Through Wafer Interconnects and Flip–Chip Bonding: A Toolbox for Advanced Hybrid Technologies for MEMS", Eurosensors XIII, 13th, European conference on Solid–State transducers [Mittelstadt, Laurie], pp. 265–272, Sep. 12–15, 1999.

Matthias Heschel, et al., "Conformal Coating by Photoresist of Sharp Corners of Anisotropically Etched Through–Holes in Silicon", Sensors and Actuators A 70, Oct. 1, 1998, pp. 75–80.

V.G. Kutchoukov, et al., "New Photoresist Coating Method for 3–D Structured Wafers", Sensors and Actuators 85 (2000) Aug. 25, 2000, pp. 377–383.

R. Schnupp, et al., "Electrodeposition of Photoresist: Optimization of Deposition Conditions, Investigation of Lithographic Processes and Chemical Resistance", Sensors and Actuators 85 (2000) Aug. 25, 2000, pp. 310–315.

* cited by examiner

*Primary Examiner*—John A. McPherson

(57) ABSTRACT

A method for using an excimer laser to pattern electrodeposited photoresist on a sloped surface of a wafer substrate includes depositing a layer of photoresist on top of a substrate that includes a sloped surface and scanning an excimer laser beam over the layer of photoresist to expose the layer of photoresist in a desired pattern. The scanning step includes projecting the excimer laser beam in a small beam spot onto the substrate and scanning the small beam spot of the excimer layer beam relative to the substrate to define the pattern sequentially onto the substrate, including the sloped surface.

21 Claims, 7 Drawing Sheets

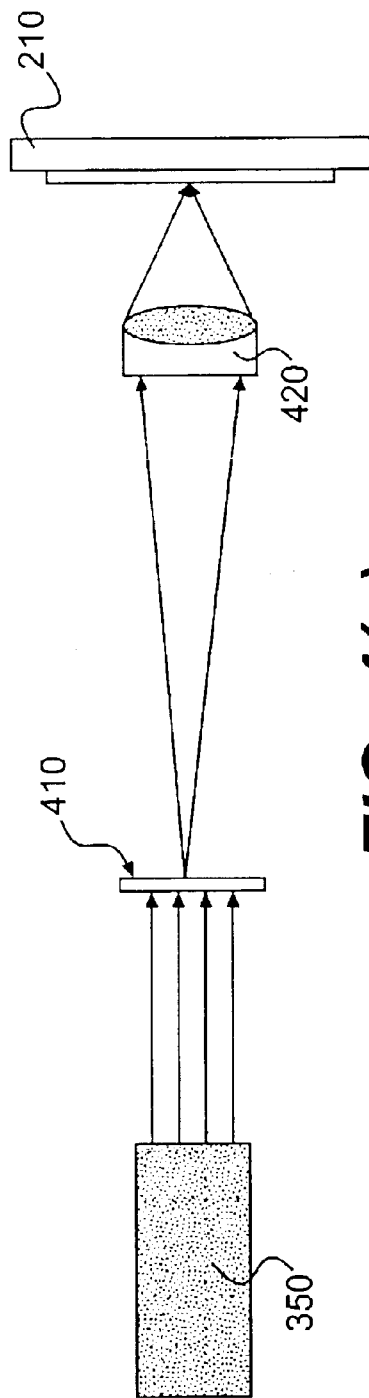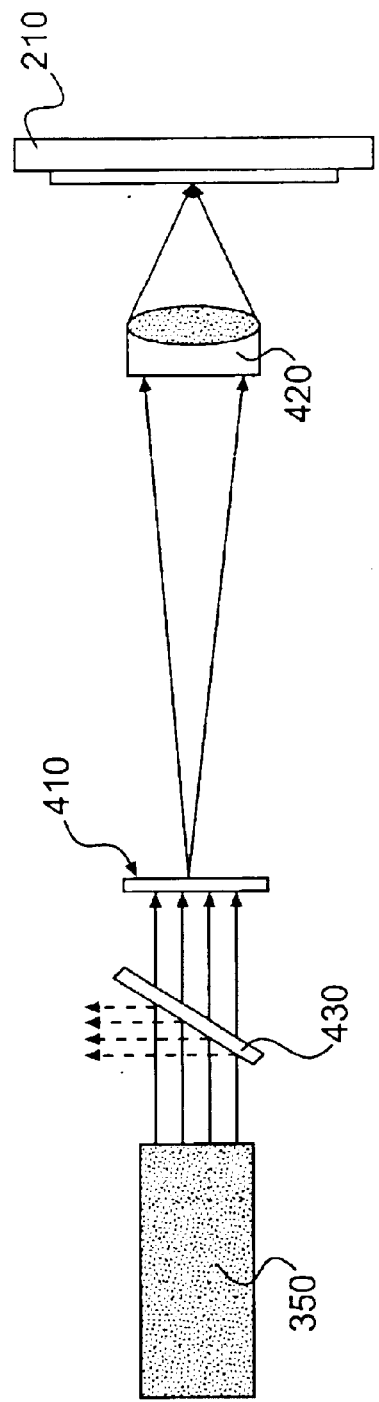

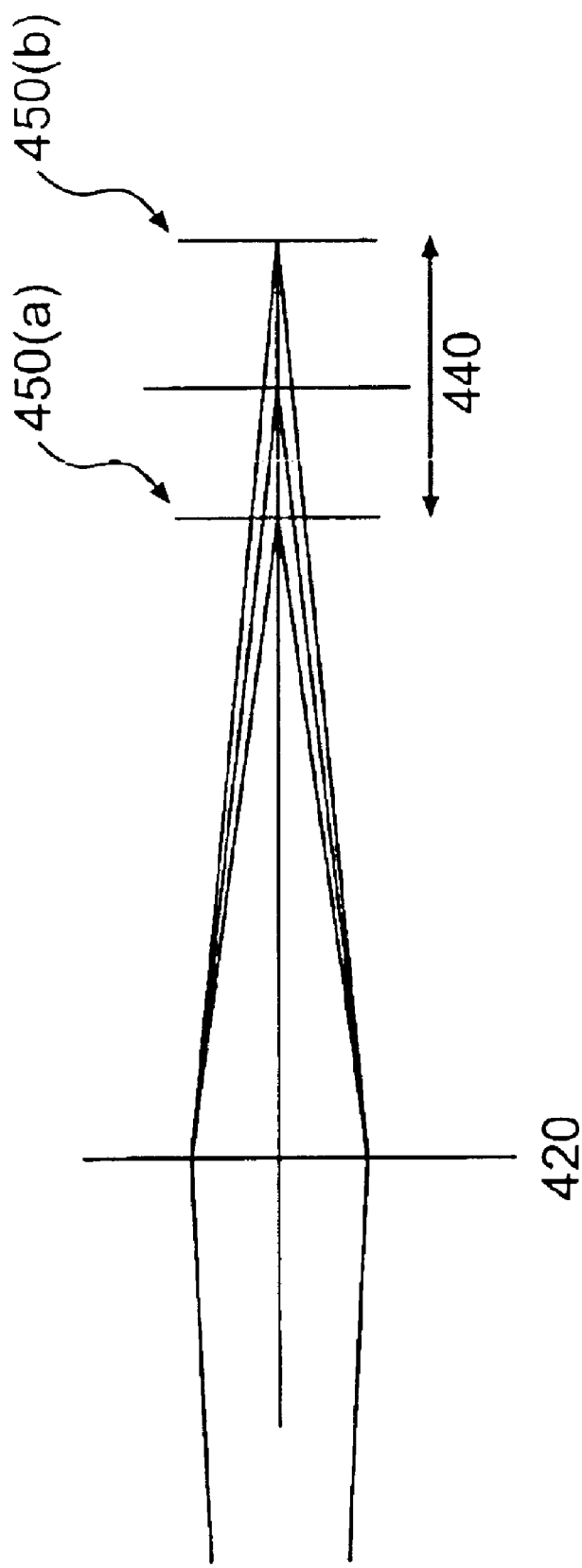

METHOD AND APPARATUS FOR USING AN EXCIMER LASER TO PATTERN ELECTRODEPOSITED PHOTORESIST

TECHNICAL FIELD

The technical field relates to microfabrication to form electrical conductors, and, in particular, to electrodeposited photoresist patterning.

BACKGROUND

Photolithography and photomasking to generate a device pattern on a wafer substrate are an essential part of fabrication of electrical conductor devices. A photolithographic device fabrication process involves covering regions of a thin film on a silicon (Si) wafer substrate that are not to be etched with a photoresist mask, and etching the thin film from regions that are not protected by the photoresist mask. As a result, conductor traces may be produced on a fabrication surface. The fabrication surface of the Si wafer is usually flat, and layers of the thin films are applied and removed on top of the flat fabrication surface. A more complicated geometry arises if the wafer itself is etched in regions that are photodefined, so that trenches or recesses whose depths are dependent on the duration of the etching, or through-holes or slots that go all the way through the wafer, may be produced on the fabrication surface. The substrate then is not planar but rather is a three-dimensional surface, upon which thin films conductors can be applied and patterned. In some applications, electrical conductors need to be patterned on top of a dielectric film on a sloped surface of a Si wafer substrate or die. The sloped surface may be either on an edge of the wafer substrate or in slots or trenches within the wafer substrate.

To pattern the electrical conductor traces on the Si wafer substrate, photoresist masks must be applied uniformly to the sloped surface of the wafer substrate. When the fabrication surface lacks flatness or includes a sloped surface, it is difficult to produce a photoresist film of high uniformity and to produce a precise exposure over the entire surface. To pattern the electrical conductor traces on the Si wafer substrate, photoresist masks must be applied uniformly to the sloped surface of the wafer substrate. Spin coating is for non-planar substrates is described, for example, in "New Photoresist Coating Method for 3-D Structured Wafers," Sensors and Actuators 85, 2000, by Kutchoukov et al. Kutchoukov et al. present a method for the uniform coating with standard photoresist of a (100)-Si semiconductor wafer containing anisotropically wetetched through-holes. The coating method is based on photoresist dispensing on the mask opening side of the wafer and spinning the wafer from both sides in a saturated photoresist solvent atmosphere.

Another method for applying photoresist over complex three-dimensional surfaces is by electroplating. Thereafter, the photoresist is exposed to ultraviolet (UV) light in a desired pattern and selectively removed to define the pattern so that the metal conductors traces may be formed.

Patterning the photoresist after the photoresist is applied onto a three-dimensional sloped substrate is a further complication. A UV light source typically projects a mask, which contains the desired pattern, onto the substrate. An excimer laser is sometimes used as the UV source for exposing the photoresist to the mask pattern. U.S. Pat. No. 4,773,750, entitled "Deep-UV Lithography," describes using an excimer laser for lithography, where fine features can be made on a flat surface using a projection lens. However, since photo imaging tools, such as lithography machines or projection lenses, are designed to make precise features on the wafer surface, the photo imaging tools typically have limited depth of focus. Therefore, a patterned mask does not work well on a sloped surface because the pattern typically loses definition on the slope.

FIG. 1 illustrates the problem with using a projection lens for patterning photoresist on a sloped surface. A Si wafer substrate 110 has a sloped surface 160(c). In order to pattern conductor traces 170 on the sloped surface 160(c), two projection lenses 180(a), 180(b) are exposed onto the sloped surface 160(c). Due to the depth of the sloped surface 160(c) and the limited focus of the projection lenses 180(a), 180(b), the projection lens 180(b) directed at a trench 160(b) of the sloped surface 160(c) tends to lose definition. As a result, the photoresist pattern typically becomes out of focus as the sloped surface 160(c) moves away from a surface 160(a) of the wafer substrate 110.

SUMMARY

A method for using an excimer laser to pattern electrodeposited photoresist on a sloped surface includes depositing a layer of photoresist on top of a substrate that includes a sloped surface and scanning an excimer laser beam over the layer of photoresist to expose the layer of photoresist in a desired pattern. The scanning step includes projecting the excimer laser beam in a small beam spot onto the substrate and scanning the small beam spot of the excimer layer beam relative to the substrate to define the pattern sequentially onto the substrate, including the sloped surface.

One embodiment of an apparatus for using an excimer laser to pattern electrodeposited photoresist on a sloped surface of a substrate includes an excimer laser beam scanned over a layer of photoresist to expose the layer of photoresist in a desired pattern, a mask with an aperture that selects a portion of the excimer laser beam to be projected onto the substrate, and a projection lens that projects an image of the aperture as a small beam spot onto the substrate. The pattern may be sequentially defined onto the substrate, including the sloped surface, by moving the small beam spot of the excimer layer beam relative to the substrate.

Another embodiment of the apparatus for using an excimer laser to pattern electrodeposited photoresist on a sloped surface of a substrate includes an excimer laser beam scanned over a layer of photoresist to expose the layer of photoresist in a desired pattern and a telescope lens system that forms a collimated excimer laser beam to be projected onto the substrate. The pattern may be sequentially defined onto the substrate, including the sloped surface, by moving the small beam spot of the excimer layer beam relative to the substrate.

Since the small beam spot of the excimer laser beam does not diverge substantially, no refocusing or repositioning is necessary to pattern the layer of photoresist on the sloped surface. Accordingly, tight tolerances and fine lines and spaces of the pattern may be maintained, eliminating the need for a complicated processing sequence.

DESCRIPTION OF THE DRAWINGS

The preferred embodiments of the method for using an excimer laser to pattern electrodeposited photoresist on a sloped surface will be described in detail with reference to the following figures, in which like numerals refer to like elements, and wherein:

FIGS. 3 and 4(a)–(c) illustrate a first exemplary method for using an excimer laser to pattern electrodeposited photoresist on the sloped surface of the exemplary wafer substrate of FIG. 2;

DETAILED DESCRIPTION

Photolithography and photomasking to generate a device pattern on a silicon (Si) wafer substrate have been an essential part of fabrication of electrical conductor devices. In a photolithographic device fabrication process, a photoresist material may be first coated on a surface of a wafer substrate. The photoresist material is a photosensitive resin that loses its resistance to chemical etching when exposed to radiation and is used especially in the transference of a circuit pattern to a semiconductor chip during the production of an integrated circuit. Then, ultraviolet (UV) light may be radiated on the photoresist material through a patterned mask placed on top of the coated wafer substrate, thereby transferring device patterns formed in the mask to the photoresist material. Next, regions of the photoresist material unexposed to the UV light may be removed in a photographic development process, leaving exposed regions of the photoresist material on the wafer substrate, thereby forming a photoresist mask. Thereafter, etching may be performed to remove regions of the wafer substrate not covered by the photoresist mask. Subsequently, the photoresist mask may be removed, forming conductor traces on the wafer substrate.

Fabrication of a wafer is described, for example, in "Conformal Coating by Photoresist of Sharp Corners of Anisotropically Etched Through-Holes in Silicon," Sensors and Actuators A 70, 1998, by Heschel et al., which is incorporated herein by reference. Heschel et al. describe a new photoresist treatment yielding conformal coating of three-dimensional Si structures, including the sharp corners of through-holes obtained by anisotropic etching in (100)-Si. Photoresist reflow from these corners is avoided by replacing the conventional baking procedure with a vacuum treatment, which allows the photoresist to be used for lift-off processes.

Electrodeposition of photoresist is described, for example, in "Electrodeposition of Photoresist: optimization of deposition conditions, investigation of lithographic processes and Chemical Resistance," Sensors and Actuators 85, 2000, by Schnupp et al., which is incorporated herein by reference. Schnumm et al. describe electrodeposition of photoresist that allows the fabrication of wafer through-hole interconnections and backside contacts to electrodes and transistors.

Figure 1:
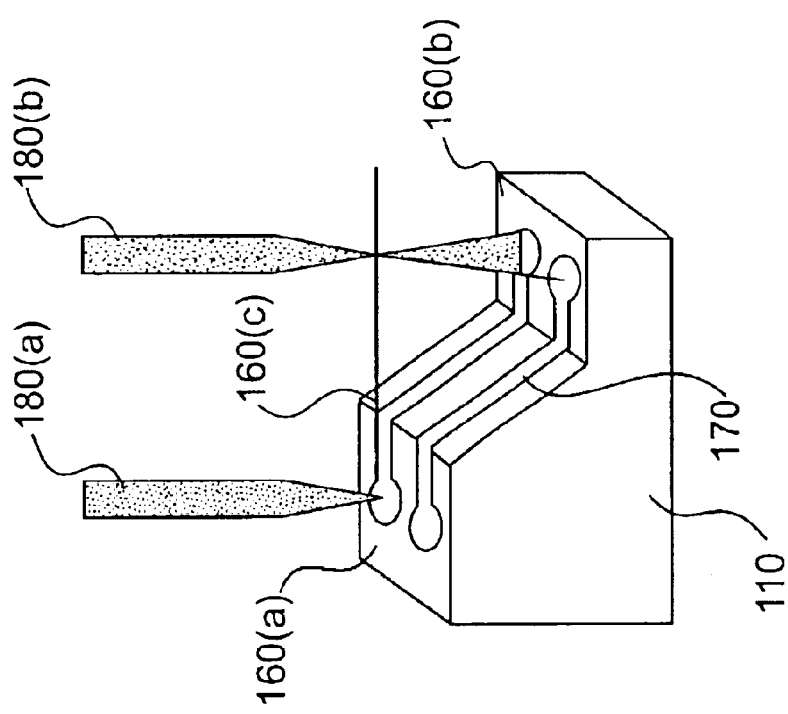
FIG. 1 illustrates a prior art method for patterning photoresist on a sloped surface using a projection lens.
Figure 2:
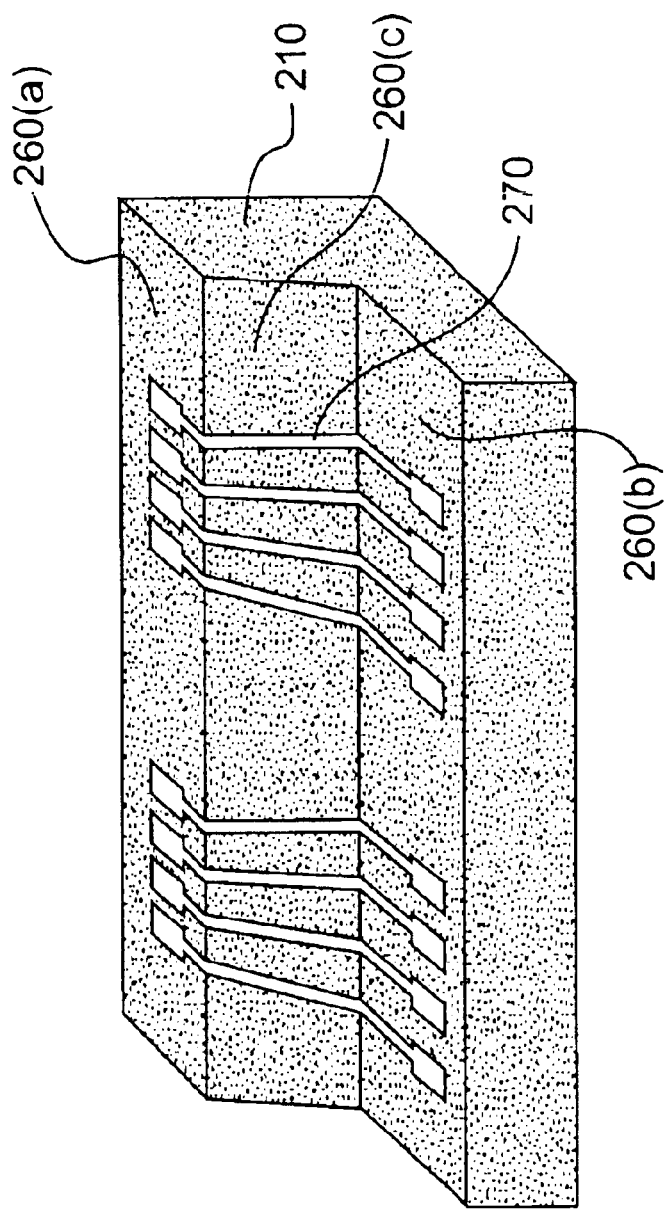
FIG. 2 illustrates an exemplary wafer substrate with electrical conductors patterned on a sloped surface of the exemplary wafer substrate.

FIG. 2 illustrates an exemplary wafer substrate 210 with electrical conductors patterned on a sloped surface 260(c), i.e., slope. Conductor traces 270 may be patterned on the sloped surface 260(c). The sloped surface 260(c) can be formed by etching the wafer substrate 210. The conductor traces 270 may extend from a flat surface 260(a) of the wafer substrate 210 to a bottom of a trench 260(b) of the sloped surface 260(c).

FIGS. 3 and 4(a)–4(c) illustrate a first exemplary method for using an excimer laser to pattern electrodeposited photoresist on the sloped surface 260(c) of the exemplary wafer substrate 210 of FIG. 2. The excimer laser is a laser that uses a noble-gas halide to generate radiation usually in the UV region of a spectrum. The excimer laser beam used to pattern the electrodeposited photoresist on the sloped surface 260(c) typically has a wavelength of 308 nanometer, near the optimum absorption wavelengths for the photoresist patterning. Using an excimer laser to pattern photoresist on a flat surface is described, for example, in U.S. Pat. No. 4,773,750, to Bruning, entitled "Deep-UV Lithography," which is incorporated herein by reference.

Figure 3:
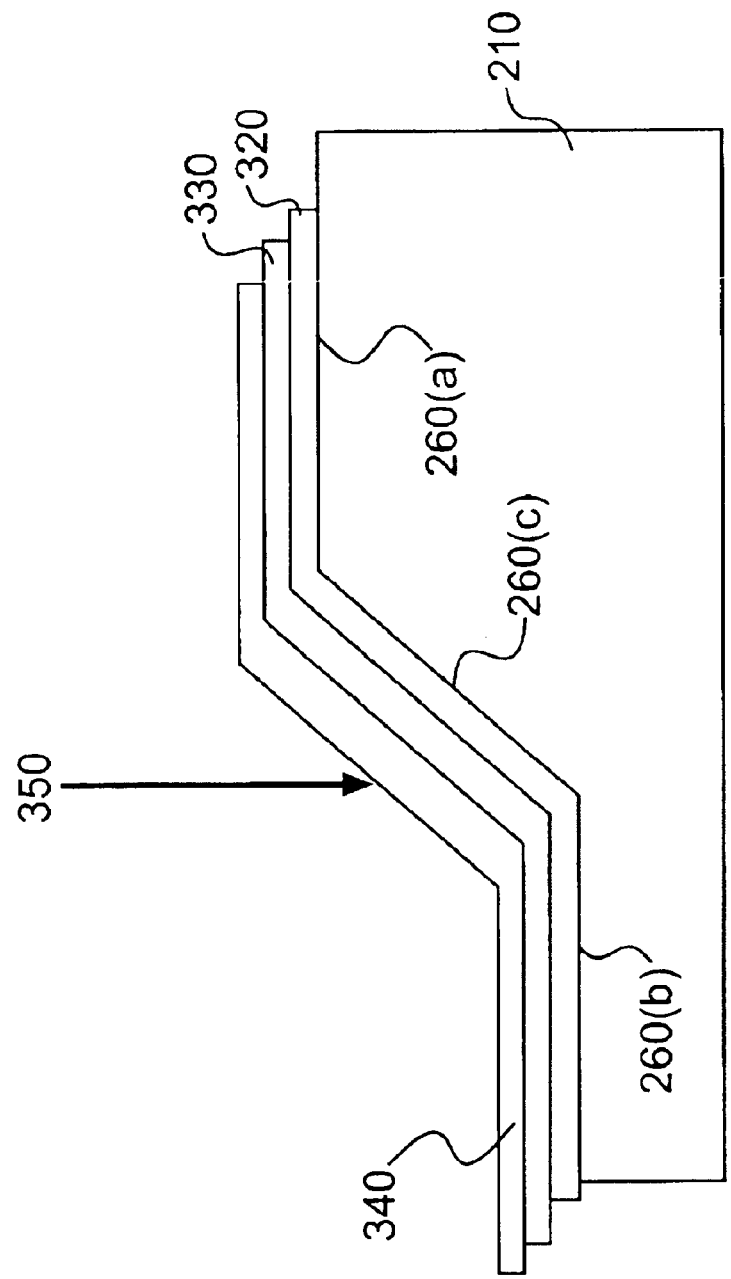

Referring to FIG. 3, the Si wafer substrate 210 has been etched to form the sloped surface 260(c) and the trench 260(b). The sloped surface 260(c) may extend all the way through the Si wafer substrate 210, so that holes appear in the wafer substrate 210 and extend through to the back side of the wafer substrate 210. A layer of dielectric 320 may be coated on top of the wafer substrate 210 for insulation. On top of the dielectric 320, a layer of metal 330 may be deposited to later form conductor traces 270 (shown in FIG. 2). Next, a layer of electrodeposited photoresist 340 may be deposited on top of the metal layer 330. Thereafter, an excimer laser beam 350 may be scanned down the sloped surface 260(c) of the wafer substrate 210 to pattern the layer of photoresist 340 on the sloped surface 260(c).

FIGS. 4(a)–4(c) illustrate in detail the first exemplary method for using an excimer laser to pattern electrodeposited photoresist on the sloped surface 260(c) of the wafer substrate 210. Referring to FIG. 4(a), the first exemplary method for using an excimer laser to pattern electrodeposited photoresist on the slopes 260(c) uses a mask 410 with an aperture to select a portion of the excimer laser beam to be projected onto the sloped surface 260(c). Then, a projection lens 420 is used to demagnify and project an image of the aperture as a small beam spot onto the wafer substrate 210 including the sloped surface 260(c). The small beam spot of the excimer laser beam 350 typically has a diameter of as narrow as 10 μm and as wide as several hundred microns. The projection lens 420 typically has a long focal length so as to project the excimer laser beam 350 onto the sloped surface 260(c) in rays that are substantially parallel to one another.

Next, a desired pattern may be sequentially defined onto the wafer substrate 210, which includes the sloped surface 260(c), by moving the small beam spot of the excimer laser beam 350 relative to the wafer substrate 210. In one embodiment, the wafer substrate 210 is moved underneath a stationary excimer laser beam 350 to define the pattern. In another embodiment, the excimer laser beam 350 is moved over a stationary wafer substrate 210 to define the pattern on the sloped surface 260(c). The method of moving the small beam spot over the surface is similar to scanning a small electron beam spot in direct write electron beam lithography (EBL) systems. EBL is a technique for creating extremely fine patterns for integrated circuits, and direct write EBL systems are the most common EBL systems.

Referring to FIG. 4(b), the excimer laser beam 350 may be adjusted using a beamsplitter 430. The beamsplitter 430 typically reduces transmitted power of the excimer laser beam 350 so as not to damage the photoresist 340.

FIG. 4(c) illustrates an acceptable depth of field for the projection lens 420 of FIGS. 4(a) and 4(b). The zone of acceptable definition 440 extends from a near-limit of depth-of-field 450(a) to a far-limit of depth-of-field 450(b). Because the focal length of a projection lens 420 is sufficiently long so that the depth of focus is longer than the depth of the pattern being etched, no refocusing or repositioning is necessary to keep the excimer laser beam in focus. As a result, tight tolerances and fine lines and spaces of the pattern may be maintained, eliminating the need for a complicated processing sequence.

Figure 5:
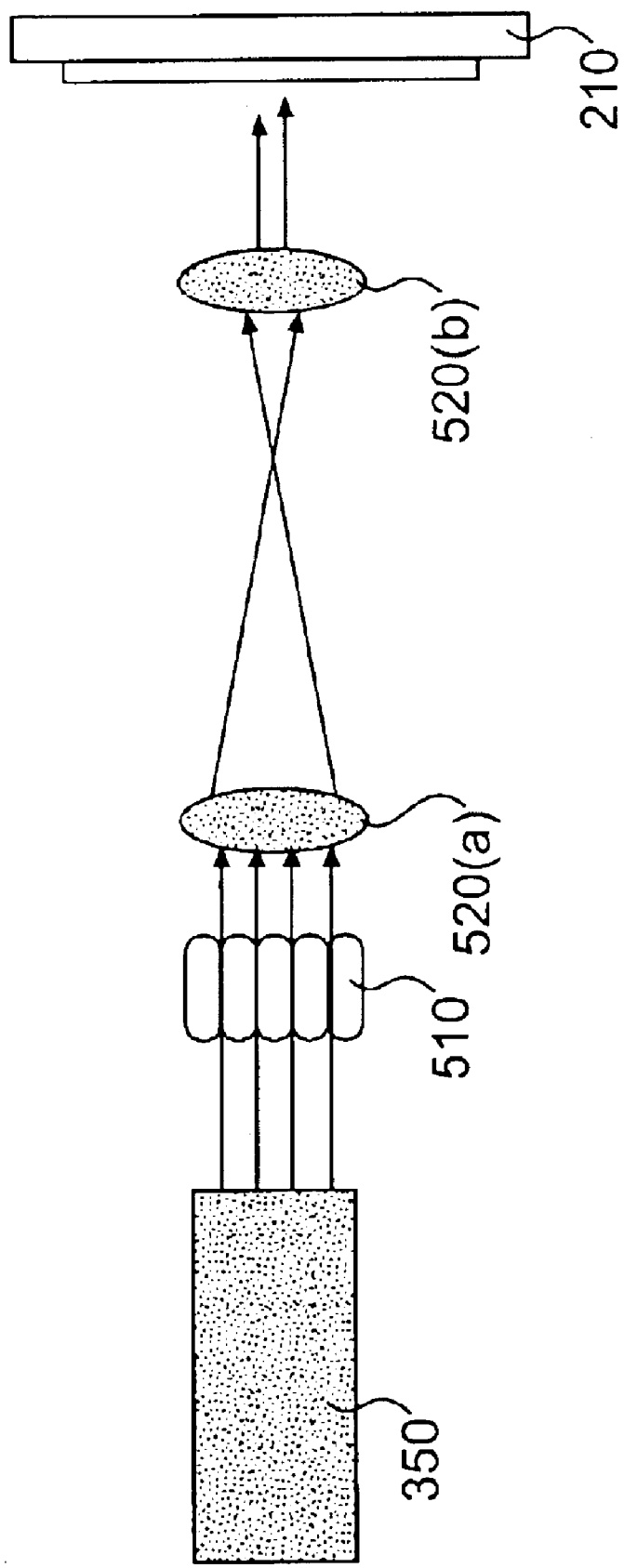
FIG. 5 illustrates a second exemplary method for using an excimer laser to pattern electrodeposited photoresist on the sloped surface of the exemplary wafer substrate of FIG. 2.

FIG. 5 illustrates a second exemplary method for using the excimer laser beam 350 to pattern electrodeposited photoresist on the slopes 260(c) of the wafer substrate 210. The second exemplary method uses a telescope lens system that includes two lenses 520(a) and 520(b). The telescope lens system may form a straight collimated excimer laser beam 350 to be projected onto the wafer substrate 210. A homogenizer 510 may need to be used to uniformly expose the collimated excimer laser beam 350 across a cross-section of the wafer substrate 210, which includes the sloped surface 260(c).

Next, a desired pattern may be sequentially defined onto the sloped surface 260(c) of the wafer substrate 210 by moving the small beam spot of the excimer laser beam 350 relative to the wafer substrate 210. The excimer laser beam 350 may be scanned down the slopes 260(c) of the wafer substrate 210 in a direction perpendicular to the surface 260(a) of the wafer substrate 210, taking advantage of the depth of focus of the excimer laser beam 350.

After the pattern has been defined, portions of the photoresist 340 not exposed to the excimer laser 350 may be etched with chemically reactive gaseous particles or chemical developing solutions, whereas portions of the photoresist 340 exposed to the excimer laser 350 may remain on the wafer substrate 210 and cover the metal 330 underneath, forming a photoresist mask. After the photoresist 340 is removed, the conductor traces 270 (shown in FIG. 2) may be formed on the wafer substrate 210.

Figure 6:
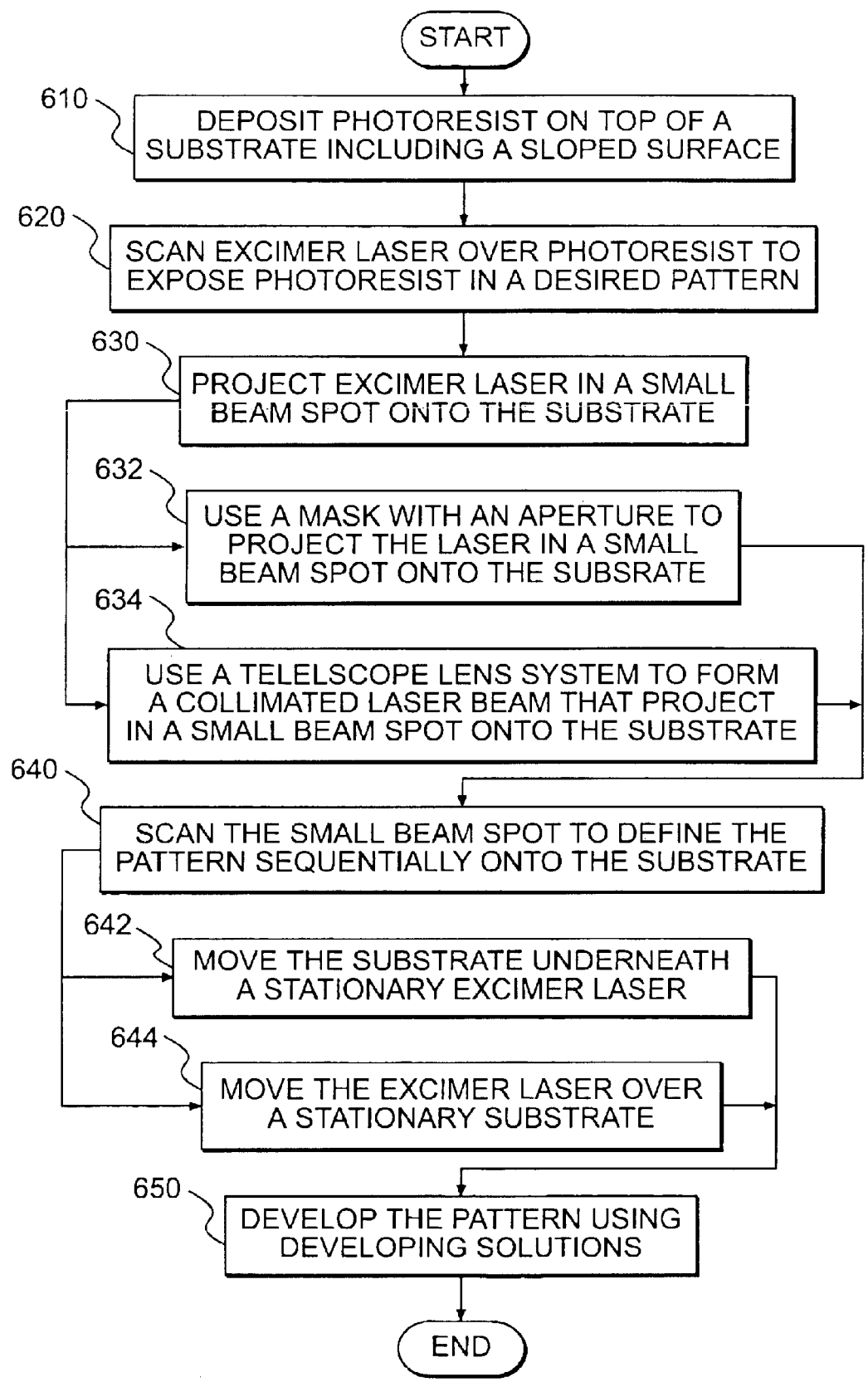
FIG. 6 is a flow chart illustrating the exemplary methods of FIGS. 3–5 for using an excimer laser to pattern electrodeposited photoresist on the sloped surface of the exemplary wafer substrate of FIG. 2.

FIG. 6 is a flow chart illustrating the exemplary methods of FIGS. 3–5 for using an excimer laser to pattern electrodeposited photoresist on the sloped surface 260(c) of the wafer substrate 210. After a layer of dielectric 320 and a metal layer 330 are coated on top of the wafer substrate 210, a layer of photoresist 340 may be deposited over the wafer substrate 210, which includes the sloped surface 260(c), step 610. Thereafter, a narrow excimer laser beam 350 may be scanned over the layer of photoresist 340 to expose the layer of photoresist in a desired pattern, step 620.

The narrow excimer laser beam 350 may be projected in a small beam spot onto the wafer substrate 210, step 630. One method uses a mask 410 with an aperture to project the excimer laser beam 350 in the small beam spot onto the wafer substrate 210, step 632. Another method uses a telescope lens system to form a collimated laser beam 350 that project in the small beam spot onto the wafer substrate 210, step 634.

Next, the small beam spot of the narrow excimer layer beam 350 may be scanned relative to the wafer substrate 210 to define the pattern sequentially onto the wafer substrate 210, step 640. The pattern may be defined by moving the wafer substrate 210 underneath a stationary excimer layer beam 350, step 642. Alternatively, the pattern may be defined by moving the excimer laser beam 350 over a stationary wafer substrate 210, step 644. Finally, the pattern may be developed using developing solutions, step 650. For example, portions of the photoresist layer 340 not exposed to the excimer laser beam 350 may be etched, whereas portions of the photoresist 340 exposed to the excimer laser beam 350 may remain on the wafer substrate 210 and cover the metal layer 330 underneath.

While the method and apparatus for using an excimer laser to pattern electrodeposited photoresist on a sloped surface have been described in connection with an exemplary embodiment, those skilled in the art will understand that many modifications in light of these teachings are possible, and this application is intended to cover any variations thereof.

What is claimed is:

1. A method for using an excimer laser to pattern electrodeposited photoresist on a sloped surface, comprising:

depositing a layer of photoresist on top of a substrate that includes a sloped surface; and scanning an excimer laser beam over the layer of photoresist to expose the layer of photoresist in a desired pattern, wherein the scanning step comprises:

projecting the excimer laser beam in a small beam spot onto the substrate, including the sloped surface; and scanning the small beam spot of the excimer layer beam relative to the substrate to define the pattern sequentially onto the substrate, including the sloped surface.

2. The method of claim 1, wherein the projecting step includes using a mask with an aperture to project the excimer laser beam in the small beam spot onto the substrate, including the sloped surface.

3. The method of claim 2, wherein the scanning the small beam spot step includes moving the substrate underneath a stationary excimer laser beam to define the pattern.

4. The method of claim 2, wherein the scanning the small beam spot step includes moving the excimer laser beam over a stationary substrate to define the pattern.

5. The method of claim 2, further comprising adjusting the excimer laser beam using a beam splitter to reduce transmitted powers of the excimer laser beam so as not to damage the layer of photoresist.

6. The method of claim 1, wherein the projecting step includes using a telescope lens system to form a collimated excimer laser beam to be projected onto the substrate, including the sloped surface.

7. The method of claim 6, wherein the scanning the small beam spot step includes moving the substrate underneath a stationary collimated excimer laser beam to define the pattern.

8. The method of claim 6, wherein the scanning the small beam spot step includes moving the collimated excimer laser beam over a stationary substrate to define the pattern.

9. The method of claim 6, further comprising using a homogenizer to uniformly expose the collimated excimer laser beam across a cross-section of the substrate, including the sloped surface.

10. The method of claim 1, further comprising developing the pattern using developing solutions.

11. An apparatus for using an excimer laser to pattern electrodeposited photoresist on a sloped surface of a substrate, comprising:

an excimer laser beam scanned over a layer of photoresist to expose the layer of photoresist in a desired pattern, wherein the layer of photoresist is deposited on top of a substrate that includes a sloped surface;

a mask with an aperture that selects a portion of the excimer laser beam to be projected onto the substrate, including the sloped surface; and a projection lens that projects an image of the aperture as a small beam spot onto the substrate, including the sloped surface, wherein the pattern is sequentially defined onto the substrate, including the sloped surface, by moving the small beam spot of the excimer layer beam relative to the substrate.

12. The apparatus of claim 11, wherein the excimer laser beam has a wavelength near optimum absorption wavelengths for photoresist patterning.

13. The apparatus of claim 11, wherein the projection lens has a long focal length so as to project the excimer laser beam onto the sloped surface in rays that are substantially parallel.

14. The apparatus of claim 11, wherein the small beam spot of the excimer laser beam has a diameter of as narrow as 10 μm and as wide as several hundred microns.

15. The apparatus of claim 11, wherein the sloped surface of the substrate is moved underneath a stationary excimer laser beam to define the pattern.

16. The apparatus of claim 11, wherein the excimer laser beam is moved over a stationary sloped surface of the substrate to define the pattern.

17. The apparatus of claim 11, further comprising a beam splitter that adjusts the straight collimated excimer laser beam to reduce transmitted powers of the excimer laser beam so as not to damage the layer of photoresist.

18. An apparatus for using an excimer laser to pattern electrodeposited photoresist on a sloped surface of a substrate, comprising:

an excimer laser beam scanned over a layer of photoresist to expose the layer of photoresist in a desired pattern, wherein the layer of photoresist is deposited on top of a substrate that includes a sloped surface; an a telescope lens system that forms a collimated excimer laser beam to be projected onto the substrate, including the sloped surface, wherein the pattern is sequentially defined onto the substrate, including the sloped surface, by moving the small beam spot of the excimer layer beam relative to the substrate.

19. The apparatus of claim 18, further comprising one or more homogenizers that uniformly expose the collimated excimer laser beam across a cross-section of the substrate, including the sloped surface.

20. The apparatus of claim 18, wherein the excimer laser beam has a wavelength near optimum absorption wavelengths for photoresist patterning.

21. The apparatus of claim 18, wherein the small beam spot of the excimer laser beam has a diameter of as narrow as 10 μm and as wide as several hundred microns.

* * * * *